(12) United States Patent
Choi et al.

(10) Patent No.: US 8,351,275 B2
(45) Date of Patent: Jan. 8, 2013

(54) PROGRAMMING METHOD FOR FLASH MEMORY DEVICE

(75) Inventors: Hyun-jin Choi, Daejeon (KR); Chan-ik Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 338 days.

(21) Appl. No.: 12/776,620

(22) Filed: May 10, 2010

(65) Prior Publication Data

US 2010/0290283 A1 Nov. 18, 2010

(30) Foreign Application Priority Data

May 13, 2009 (KR) .................. 10-2009-0041763

(51) Int. Cl.
*G11C 16/04* (2006.01)
(52) U.S. Cl. .......... 365/185.28; 365/185.03; 365/185.11
(58) Field of Classification Search ............. 365/185.03, 365/185.11, 185.28
See application file for complete search history.

(56) References Cited

U.S. PATENT DOCUMENTS

| 2008/0094893 A1* | 4/2008 | Choi ................... 365/185.03 |
| 2008/0175065 A1* | 7/2008 | Choi et al. ............ 365/185.22 |
| 2008/0177934 A1* | 7/2008 | Yu et al. ................. 711/103 |

FOREIGN PATENT DOCUMENTS

| JP | 2003-036681 | 2/2003 |
| JP | 2003-187574 | 7/2003 |
| KR | 1020040078785 A | 9/2004 |
| KR | 1020050025255 A | 3/2005 |

* cited by examiner

*Primary Examiner* — Hoai V Ho
(74) *Attorney, Agent, or Firm* — Myers Bigel Sibley & Sajovec, P.A.

(57) ABSTRACT

Provided is a programming method that increases writing performance of a flash memory device. The programming method for a flash memory device that includes a plurality of banks including a plurality of memory cells for storing multi-bit data includes the following: programming a most significant bit (MSB) page with respect to banks of a first bank group; programming a least significant bit (LSB) page with respect to banks of a second bank group; programming the MSB page with respect to the banks of the second bank group; and programming the LSB page with respect to the banks of the first bank group.

10 Claims, 7 Drawing Sheets

FIG. 5

| B1 | B2 | B3 | B4 |
|---|---|---|---|
| MSB (1st) | MSB (2nd) | LSB (3rd) | LSB (4th) |
| LSB (7th) | LSB (8th) | MSB (5th) | MSB (6th) |
| MSB (9th) | MSB (10th) | LSB (11th) | LSB (12th) |
| LSB (15th) | LSB (16th) | MSB (13th) | MSB (14th) |

FIG. 7

| B1 | B2 | B3 | B4 |
|---|---|---|---|
| LSB (1st) | | LSB (2nd) | |
| MSB (3rd) | LSB (5th) | MSB (4th) | LSB (6th) |
| LSB (9th) | MSB (7th) | LSB (10th) | MSB (8th) |
| MSB (11th) | LSB (13th) | MSB (12th) | LSB (14th) |

PROGRAMMING METHOD FOR FLASH MEMORY DEVICE

REFERENCE TO PRIORITY APPLICATION

This application claims the benefit of Korean Patent Application No. 10-2009-0041763, filed May 13, 2009, the contents of which are hereby incorporated herein by reference.

FIELD OF THE INVENTION

The inventive concept relates to a flash memory device such as a solid state disk (SSD) or a flash memory card, and more particularly, to a programming method for a flash memory device.

BACKGROUND

Generally, a flash memory device has a function of electrically erasing all data of a cell at once, and thus is widely used in computers and memory cards. Recently, as use of mobile information devices, such as cell phones, personal digital assistants (PDAs), and digital cameras, is rapidly increasing, the flash memory device, instead of a hard disk, is widely used as a storage device. The mobile information devices require high capacity storage devices in order to provide various functions. Accordingly, a flash memory device that can store multi-bit data of 2 bits or more in one memory cell has being suggested.

SUMMARY

According to an aspect of the inventive concept, there is provided a programming method for a flash memory device that includes a plurality of banks including a plurality of memory cells for storing multi-bit data, the programming method including: programming a most significant bit (MSB) page with respect to banks of a first bank group; programming a least significant bit (LSB) page with respect to banks of a second bank group; programming the MSB page with respect to the banks of the second bank group; and programming the LSB page with respect to the banks of the first bank group.

The programming method may further include repeatedly performing the programming of the MSB page with respect to the first bank group, the programming of the LSB page with respect to the second bank group, the programming of the MSB page with respect to the second bank group, and the programming of the LSB page with respect to the first bank group, until a program of the flash memory device is completed.

According to another aspect of the inventive concept, there is provided a programming method for a flash memory device that includes a plurality of banks including a plurality of memory cells for storing multi-bit data, the programming method including: programming a least significant bit (LSB) page with respect to a first bank group; programming a most significant bit (MSB) page with respect to the first bank group; programming the LSB page with respect to a second bank group; and programming the MSB page with respect to the second bank group.

The programming method may further include repeatedly performing the programming of the LSB page with respect to the first bank group, the programming of the MSB page with respect to the first bank group, the programming of the LSB page with respect to the second bank group, and the programming of the MSB page with respect to the second bank group, until a program of the flash memory device is completed.

BRIEF DESCRIPTION OF THE DRAWINGS

FIG. 5 is a table for describing the programming method of FIG. 4;

FIG. 7 is a table for describing the programming method of FIG. 6.

DETAILED DESCRIPTION OF THE EMBODIMENTS

Figure 1:
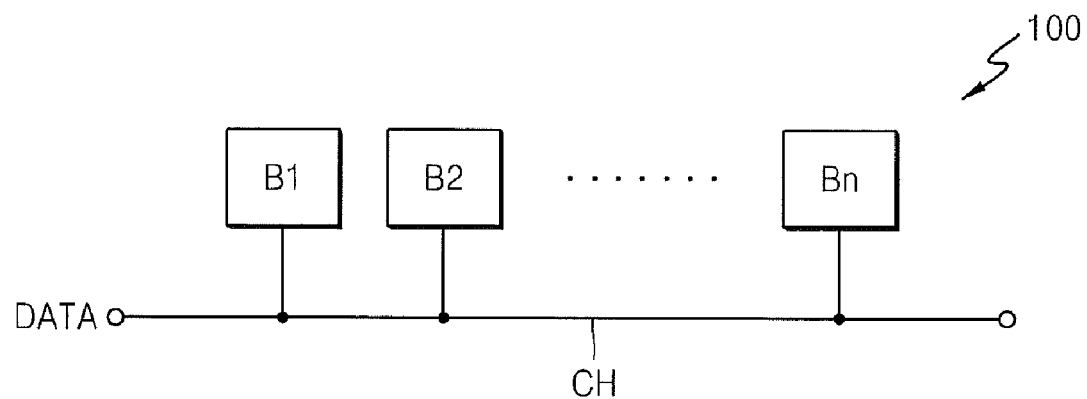
FIG. 1 is a block diagram of a flash memory device, according to an embodiment of the inventive concept.

The attached drawings for illustrating exemplary embodiments of the inventive concept are referred to in order to gain a sufficient understanding of the exemplary embodiments, the merits thereof, and the objectives accomplished by the implementation of the exemplary embodiments. Hereinafter, the exemplary embodiments will be described in detail with reference to the attached drawings. Like reference numerals in the drawings denote like elements.

FIG. 1 is a block diagram of a flash memory device 100, according to an embodiment of the inventive concept. Referring to FIG. 1, the flash memory device 100 may include first through n-th banks B1 through Bn, wherein n is an integer greater than one. The first through n-th banks B1 through Bn each include a plurality of memory cells for storing multi-bit data, and are connected via a channel CH. For example, when data DATA is to be stored in a corresponding bank from among the first through n-th banks B1 through Bn, data DATA corresponding to the first bank B1 is transmitted so as to program memory cells of the first bank B1, and then data DATA corresponding to the second bank B2 is transmitted so as to program memory cells of the second bank B2. The corresponding data DATA is transmitted to the third banks through n-th banks B3 through Bn in the same manner.

Figure 2:
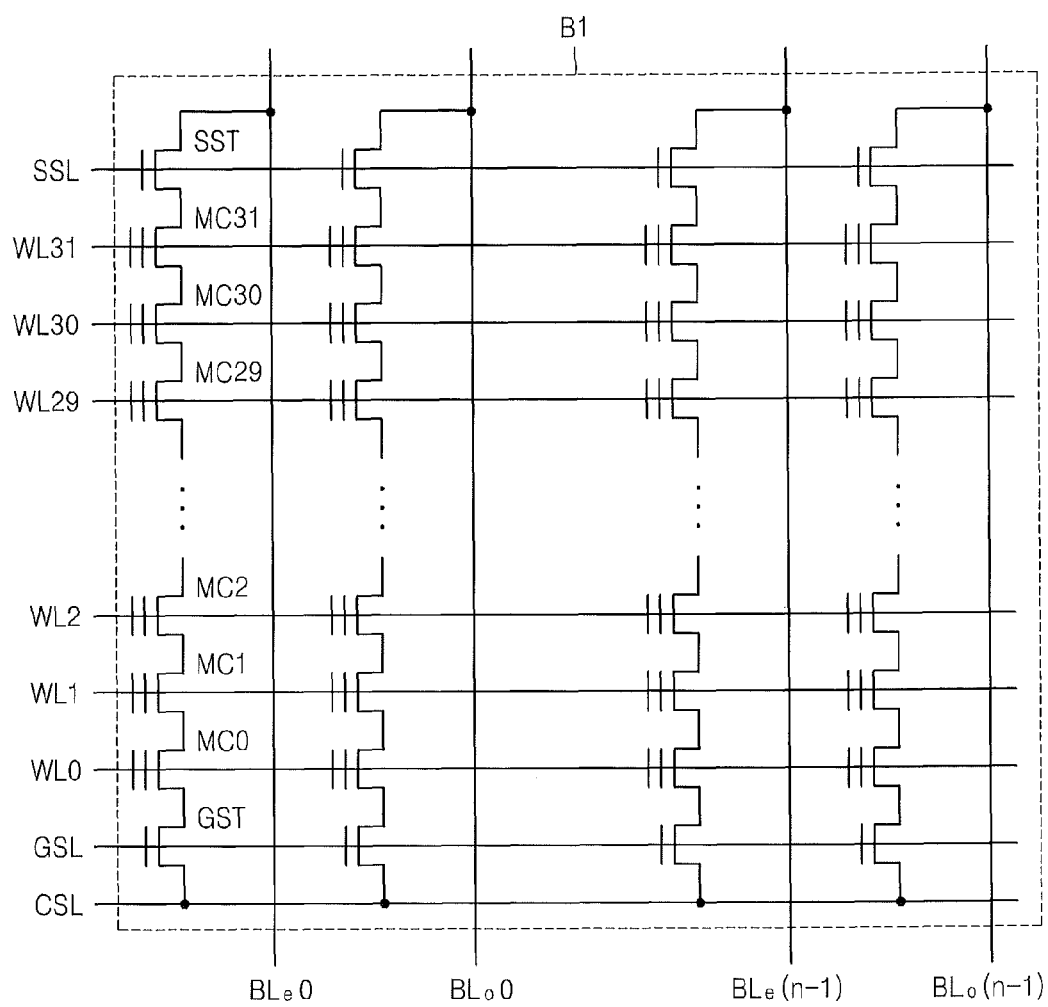
FIG. 2 is a circuit diagram of a first bank of FIG. 1.

FIG. 2 is a circuit diagram of the first bank B1 of FIG. 1. For convenience, FIG. 2 illustrates the first bank B1 of FIG. 1, but the second through n-th banks B2 through Bn may have the same structure as the first bank B1 of FIG. 2. Referring to FIGS. 1 and 2, the first bank B1 includes a plurality of strings, and each string may include a string selection transistor SST, a ground selection transistor GST, and memory cells MC0 through MC31. The string selection transistor SST may have a gate connected to a string selection line SSL, and a first terminal connected to a corresponding bit line. The ground selection transistor GST may have a gate connected to a ground selection line GSL, and a first terminal connected to a common source line CSL. The memory cells MC0 through MC31 may be interposed between a second terminal of the string selection transistor SST and a second terminal of the ground selection transistor GST, and have gates respectively connected to corresponding word lines WL0 through WL31. A plurality of bit line pairs (BLe0, BLo0) through (BLe(n-1), BLo(n-1)) may be arranged to cross the word lines WL0 through WL31. During a reading/programming operation, one bit line may be selected from among each of the bit line pairs (BLe0, BLo0) through (BLe(n-1), BLo(n-1)), and thus two pages may be formed with respect to one word line. However, one page may be formed with respect to one word line.

A programming operation for storing 2 bits of data may be divided into an operation of programming a least significant bit (LSB) page, and an operation of programming a most significant bit (MSB) page. The operations of programming the LSB page and the MSB page will now be described with respect to FIGS. 3A and 3B.

Figure 3A:
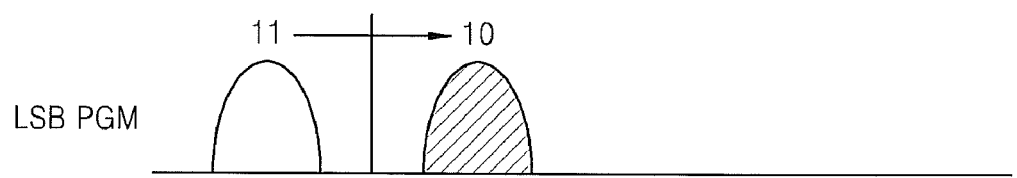
FIG. 3A is a diagram for describing an operation of programming a least significant bit (LSB) page.
Figure 3B:
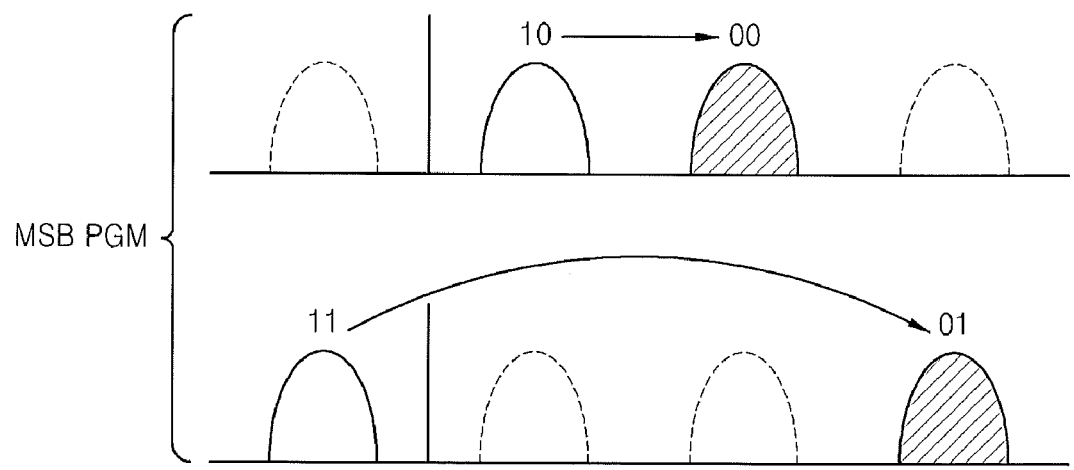
FIG. 3B is a diagram for describing an operation of programming a most significant bit (MSB) page.

FIG. 3A is a diagram for describing an operation of programming a LSB page, and FIG. 3B is a diagram for describing an operation of programming a MSB page.

One memory cell may be programmed to have one state selected from the group of "11", "10", "00", and "01" states. Hereinafter, it is assumed that a memory cell having the "11" state is an erased memory cell, the threshold voltage of a memory cell having the "10" state is higher than the threshold voltage of a memory cell having the "11" state, the threshold voltage of a memory cell having the "00" state is higher than the threshold voltage of the memory cell having the "10" state, and the threshold voltage of the memory cell having the "01" state is higher than the threshold voltage of the memory cell having the "00" state.

Here, when the LSB page is programmed with respect to the memory cell having the "11" state, the memory cell is changed to having the erased state or the "10" state, as shown in FIG. 3A. When the MSB page is programmed with respect to the memory cell having the "10" state, the memory cell is changed to having the "10" or the "00" state as shown in FIG. 3B, and when the MSB page is programmed with respect to the memory cell having the "11" state, the memory cell is changed to having the erased state or the "01" state as shown in FIG. 3B.

Figure 4:
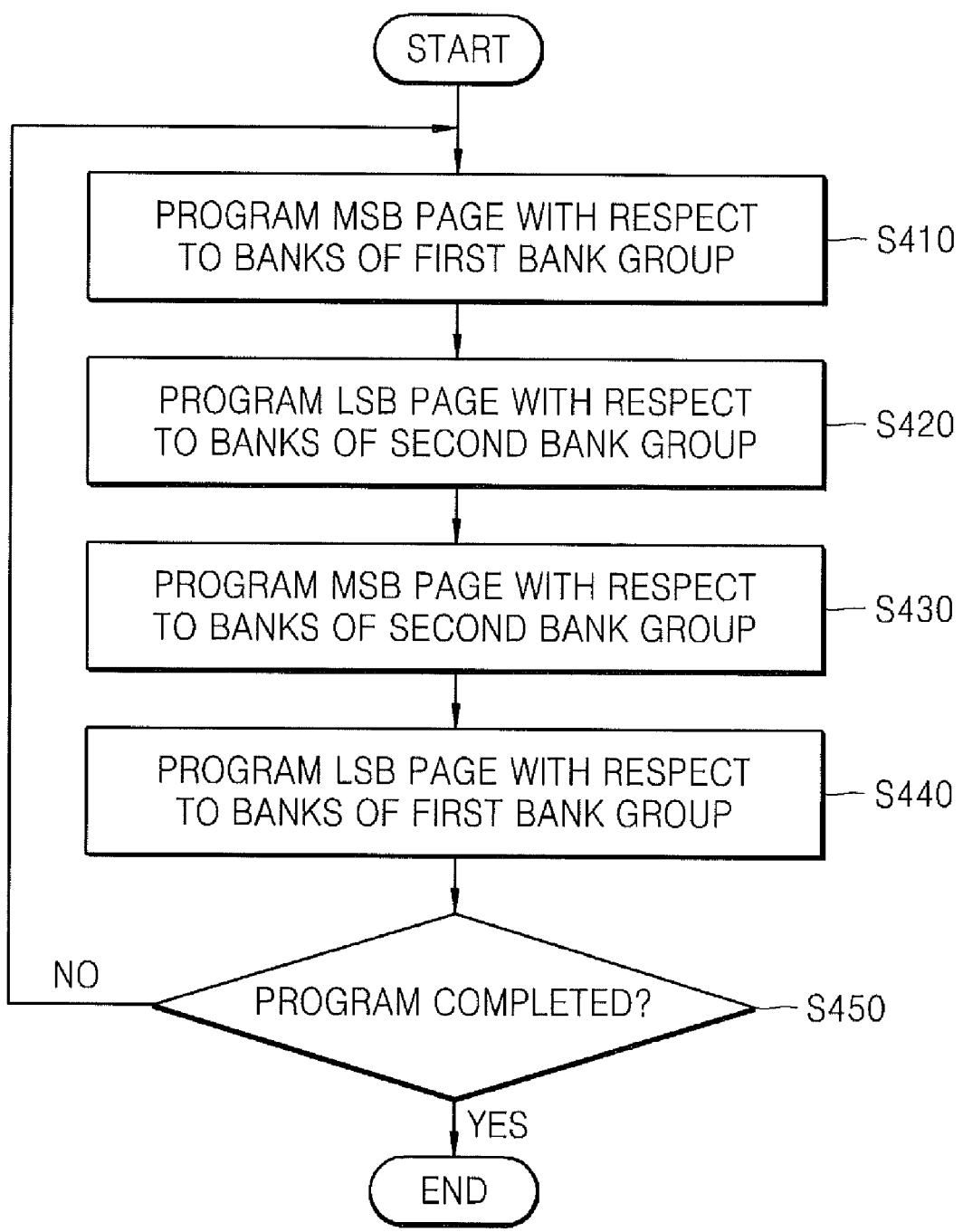
FIG. 4 is a flowchart illustrating a programming method for a flash memory device, according to an embodiment of the inventive concept.

FIG. 4 is a flowchart illustrating a programming method for a flash memory device, according to an embodiment of the inventive concept. Referring to FIG. 4, an MSB page is programmed with respect to banks of a first bank group in operation S410, and an LSB page is programmed with respect to banks of a second bank group in operation S420. The first bank group includes at least one bank including a plurality of memory cells for storing multi-bit data. The second bank group includes at least one bank that includes a plurality of memory cells for storing multi-bit data and is not included in the first bank group. For example, when the flash memory device includes 2n banks, wherein n is a natural number, the first bank group may include n banks, and the second bank group may include the remaining n banks that are not included in the first bank group. After operation S420, the MSB page is programmed with respect to the banks of the second bank group in operation S430. After operation S430, the LSB page is programmed with respect to the banks of the first bank group in operation S440. Next, it is determined whether a program of the flash memory device is completed in operation S450. If the program is not completed, operations S410 through S440 are performed.

FIG. 5 is a table for describing the programming method of FIG. 4. The programming method for a flash memory device including a first through fourth banks B1 through B4 will now be described with reference to FIGS. 4 and 5. Here, the number of banks is not limited to 4, and the programming method of FIG. 4 may be applied to a flash memory device including a different number of banks. According to an embodiment of the inventive concept, it is assumed that the first bank group includes the first and second banks B1 and B2, and the second bank group includes the third and fourth banks B3 and B4.

First in operation S410, the MSB page is programmed with respect to the first and second banks B1 and B2 included in the first bank group. In FIG. 5, the MSB page is programmed with respect to the first bank B1, and then the MSB page is programmed with respect to the second bank B2. Then, in operation S420, the LSB page is programmed with respect to the third and fourth banks B3 and B4 included in the second bank group. In FIG. 5, the LSB page is programmed with respect to the third bank B3, and then the LSB page is programmed with respect to the fourth bank B4.

In operation S430, the MSB page is programmed with respect to the third and fourth banks B3 and B4 included in the second bank group. Here, the MSB page may be programmed with respect to the third and fourth banks B3 and B4 included in the second bank group in the order of programming the LSB page in operation S420. In other words, since the LSB page is programmed with respect to the third bank B3 and then with respect to the fourth bank B4 in operation S420, the MSB page may be programmed with respect to the third bank B3 and then with respect to the fourth bank B4 in operation S430 according to the order of operation S420.

In operation S440, the LSB page is programmed with respect to the first and second banks B1 and B2 included in the first bank group. Here, the LSB page may be programmed with respect to the first and second banks B1 and B2 included in the first bank group in the order of programming the MSB page in operation S410. In other words, since the MSB page is programmed with respect to the first bank B1 and then with respect to the second bank B2 in operation S410, the LSB page may be programmed with respect to the first bank B1 and then with respect to the second bank B2 in operation S440 according to the order of operation S410.

If it is determined that the program is not completed in operation S450, operation S410 is performed, and thus the MSB page is programmed with respect to the first and second banks B1 and B2 included in the first bank group. Here, the MSB page may be programmed with respect to the first and second banks B1 and B2 included in the first bank group in the order of programming the LSB page in operation S440. In other words, since the LSB page is programmed with respect to the first bank B1 and then with respect to the second bank B2 in operation S440, the MSB page may be programmed with respect to the first bank B1, and then with respect to the second bank B2 in operation S410 according to the order of operation S440.

In operation S420, the LBS page is programmed with respect to the third and fourth banks B3 and B4 included in the second bank group. Here, the LSB page may be programmed with respect to the third and fourth banks B3 and B4 included in the second bank group in the order of programming the MSB page in operation S430. In other words, since the MSB page is programmed with respect to the third bank B3 and then with respect to the fourth bank B4 in operation S430, the LSB page may be programmed with respect to the third bank B3, and then with respect to the fourth bank B4 in operation S420 according to the order of operation S430.

Operations thereafter are performed in the same manner as the operations described above, and thus details thereof are not repeated herein.

Figure 6:
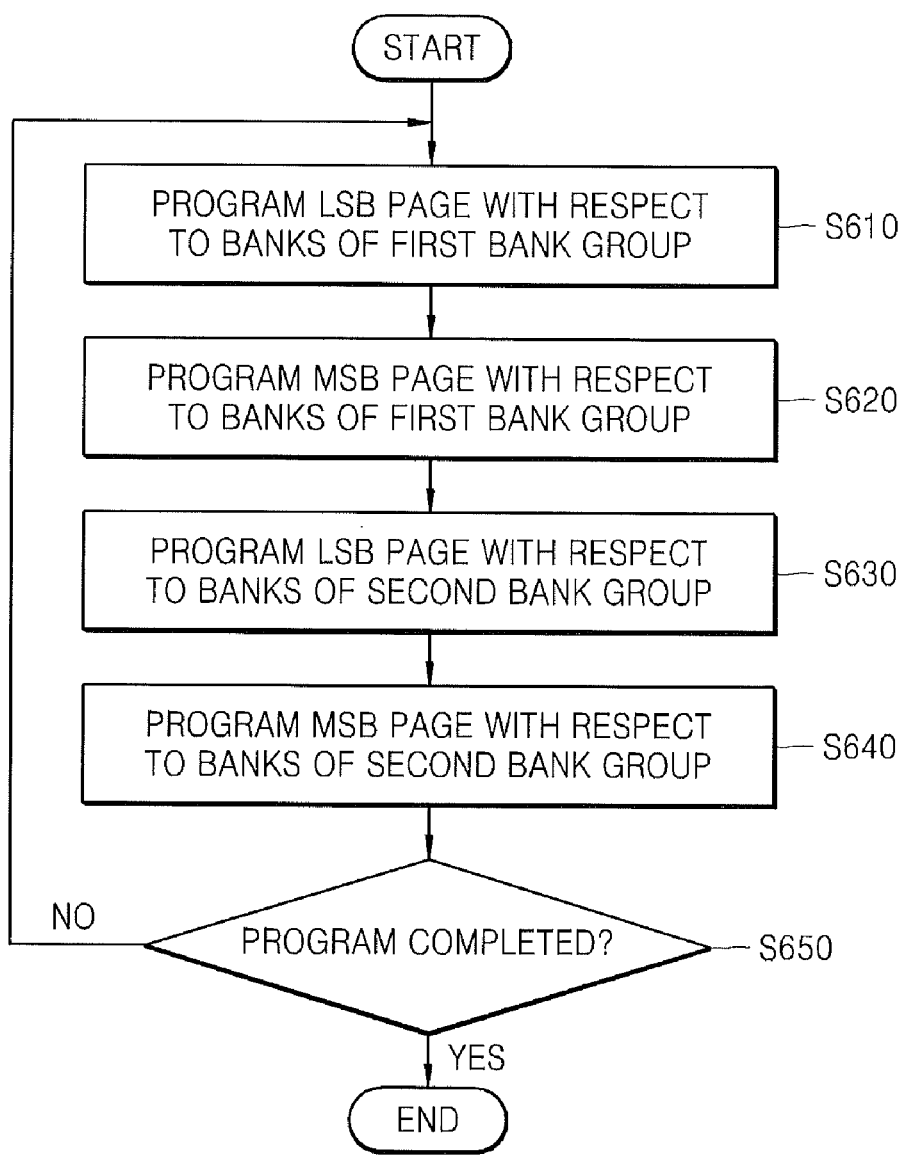
FIG. 6 is a flowchart illustrating a programming method for a flash memory device, according to another embodiment of the inventive concept.

FIG. 6 is a flowchart illustrating a programming method for a flash memory device, according to another embodiment of the inventive concept.

Referring to FIG. 6, the programming method programs an LSB page with respect to banks of a first bank group in operation S610, and then programs an MSB page with respect to the banks of the first bank group in operation S620. The first bank group includes at least one bank including a plurality of memory cells for storing multi-bit data. The second bank group includes at least one bank that includes a plurality of memory cells for storing multi-bit data and is not included in the first bank group. For example, when the flash memory device includes 2n banks, wherein n is a natural number, the first bank group may include n banks, and the second bank group may include the remaining n banks that are not included in the first bank group. After operation S620, the LSB page is programmed with respect to the banks of the second bank group in operation S630, and the MSB page is programmed with respect to the banks of the second bank group in operation S640. Then, it is determined whether a program of the flash memory device is completed in operation S650. If the program is not completed, operations S610 through S640 are performed.

FIG. 7 is a table for describing the programming method of FIG. 6.

The programming method for a flash memory device including first through fourth banks B1 through B4 will now be described with reference to FIGS. 6 and 7. However, as described above with reference to FIGS. 4 and 5, the number of banks is not limited to 4, and the programming method of FIG. 6 may be applied to a flash memory device including a different number of banks. In FIG. 7, the first bank group includes the first and third banks B1 and B3, and the second bank group includes the second and fourth banks B2 and B4.

First, the LSB page is programmed with respect to the first and third banks B1 and B3 included in the first bank group in operation S610. In FIG. 7, the LSB page is programmed with respect to the first bank B1, and then with respect to the third bank B3.

In operation S620, the MSB page is programmed with respect to the first and third banks B1 and B3 included in the first bank group. Here, the MSB page may be programmed with respect to the first and third banks B1 and B3 included in the first bank group in the order of programming the LSB page in operation S610. In other words, since the LSB page is programmed with respect to the first bank B1 and then with respect to the third bank B3 in operation S610, the MSB page may be programmed with respect to the first bank B1 and then with respect to the third bank B3 in operation S620 according to the order of operation S610.

In operation S630, the LSB page is programmed with respect to the second and fourth banks B2 and B4 included in the second bank group. In FIG. 7, the LSB page is programmed with respect to the second bank B2, and then programmed with respect to the fourth bank B4.

In operation S640, the MSB page is programmed with respect to the second and fourth banks B2 and B4 included in the second bank group. Here, the MSB page may be programmed with respect to the second and fourth banks B2 and B4 included in the second bank group in the order of programming the LSB page in operation S630. In other words, since the LSB page is programmed with respect to the second bank B2 and then with respect to the fourth bank B4 in operation S630, the MSB page may be programmed with respect to the second bank B2 and then with respect to the fourth bank B4 in operation S640 according to the order of operation S630.

If it is determined that the program is not completed in operation S650, operation S610 is performed, and thus the LSB page is programmed with respect to the first and third banks B1 and B3 included in the first bank group. Here, the LSB page may be programmed with respect to the first and third banks B1 and B3 included in the first bank group in the order of programming the MSB page in operation S620. In other words, since the MSB page is programmed with respect to the first bank B1 and then with respect to the third bank B3 in operation S620, the LSB page may be programmed with respect to the first bank B1 and then with respect to the third bank B3 in operation S610 according to the order of operation S620.

In operation S620, the MSB page is programmed with respect to the first and third banks B1 and B3 included in the first bank group. Here, as described above, since the LSB page is programmed with respect to the first bank B1 and then with respect to the third bank B3 in operation S610, the MSB page may be programmed with respect to the first bank B1 and then with respect to the third bank B3 in operation S620 according to the order of operation S610.

In operation S630, the LSB page may be programmed with respect to the second and fourth banks B2 and B4 included in the second bank group. Here, the LSB page may be programmed with respect to the second and fourth banks B2 and B4 included in the second bank group in the order of programming the MSB page in operation S640. In other words, since the MSB page is programmed with respect to the second bank B2 and then with respect to the fourth bank B4 in operation S640, the LSB page may be programmed with respect to the second bank B2 and then with respect to the fourth bank B4 in operation S630 according to the order of operation S640.

In operation S640, the MSB page is programmed with respect to the second and fourth banks B2 and B4 included in the second bank group. Here, as described above, since the LSB page is programmed with respect to the second bank B2 and then with respect to the fourth bank B4 in operation S630, the MSB page may be programmed with respect to the second bank B2 and then with respect to the fourth bank B4 in operation S640 according to the order of operation S630.

Operations thereafter are performed in the same manner as the operations described above, and thus details thereof are not repeated herein.

As described above, when a flash memory device is programmed according to an embodiment of the inventive concept, a time after programming an LSB page until programming an MSB page is shorter than a time after programming the MSB page until programming the LSB page, and thus channel waste may be reduced. This is because in the flash memory device, the time consumed to program the MSB page is longer than a time consumed to program the LSB page.

While the inventive concept has been particularly shown and described with reference to exemplary embodiments thereof, it will be understood that various changes in form and details may be made therein without departing from the spirit and scope of the following claims.

What is claimed is:

1. A programming method for a flash memory device that comprises a plurality of banks comprising a plurality of memory cells for storing multi-bit data, the programming method comprising:
    programming a most significant bit (MSB) page with respect to banks of a first bank group;
    programming a least significant bit (LSB) page with respect to banks of a second bank group after programming the MSB page with respect to the banks of the first bank group;
    programming the MSB page with respect to the banks of the second bank group after programming the LSB page with respect to the banks of the second bank group; and programming the LSB page with respect to the banks of the first bank group after programming the MSB page with respect to the banks of the second bank group.

2. The programming method of claim 1, wherein: programming the MSB page with respect to the banks of the second bank group comprises programming the MSB page with respect to the banks of the second bank group in the same order as programming the LSB page with respect to the banks of the second bank group; and programming the LSB page with respect to the banks of the first bank group comprises programming the LSB page with respect to the banks of the first bank group in the same order as programming the MSB page with respect to the banks of the first bank group.

3. The programming method of claim 1, further comprising repeatedly performing the programming of the MSB page with respect to the first bank group, the programming of the LSB page with respect to the second bank group, the programming of the MSB page with respect to the second bank group, and the programming of the LSB page with respect to the first bank group, until a program of the flash memory device is completed.

4. The programming method of claim 1, wherein the first bank group comprises half of the plurality of banks, and the second bank group comprises the remaining half of the plurality of banks.

5. A programming method for a flash memory device that comprises a plurality of banks comprising a plurality of memory cells for storing multi-bit data, the programming method comprising:

programming a least significant bit (LSB) page with respect to first and second banks of a first bank group;

programming a most significant bit (MSB) page with respect to the first and second banks of the first bank group;

programming the LSB page with respect to third and fourth banks of a second bank group; and programming the MSB page with respect to the third and fourth banks of the second bank group.

6. The programming method of claim 5, wherein:

programming the LSB page with respect to the first and second banks of the first bank group comprises programming the LSB page with respect to the first bank and then with respect to the second bank;

programming the MSB page with respect to the first and second banks of the first bank group comprises programming the MSB page with respect to the first bank and then with respect to the second bank;

programming the LSB page with respect to the third and fourth banks of the second bank group comprises programming the LSB page with respect to the third bank and then with respect to the fourth bank; and programming the MSB page with respect to the third and fourth banks of the second bank group comprises programming the MSB page with respect to the third bank and then with respect to the fourth bank.

7. The programming method of claim 5, further comprising repeatedly performing the programming of the LSB page with respect to the first bank group, the programming of the MSB page with respect to the first bank group, the programming of the LSB page with respect to the second bank group, and the programming of the MSB page with respect to the second bank group, until a program of the flash memory device is completed.

8. The programming method of claim 5, wherein the first bank group comprises half of the plurality of banks, and the second bank group comprises the remaining half of the plurality of banks.

9. The programming method of claim 2, wherein:

the first bank group comprises first and second banks;

the second bank group comprises third and fourth banks;

programming the MSB page with respect to the banks of the second bank group in the same order as programming the LSB page with respect to the banks of the second bank group comprises programming the LSB page with respect to the third bank and then with respect to the fourth bank, and programming the MSB page with respect to the third bank and then with respect to the fourth bank; and programming the LSB page with respect to the banks of the first bank group in the same order as programming the MSB page with respect to the banks of the first bank group comprises programming the MSB page with respect to the first bank and then with respect to the second bank, and programming the LSB page with respect to the first bank and then with respect to the second bank.

10. The programming method of claim 1, wherein a time after programming the LSB page with respect to the banks of the second bank group until programming the MSB page with respect to the banks of the second bank group is shorter than a time after programming the MSB page with respect to the banks of the first bank group until programming the LSB page with respect to the banks of the first bank group.

* * * * *